United States Patent [19]

Sugimoto et al.

[11] Patent Number: 5,227,761
[45] Date of Patent: Jul. 13, 1993

[54] MAGNETORESISTIVE SENSOR

[75] Inventors: Yoshiyasu Sugimoto; Ichiro Shibasaki, both of Shizuoka, Japan

[73] Assignee: Asahi Kasei Kogyo Kabushiki Kaisha, Osaka, Japan

[21] Appl. No.: 761,948

[22] PCT Filed: Jan. 25, 1991

[86] PCT No.: PCT/JP91/00082
§ 371 Date: Oct. 31, 1991
§ 102(e) Date: Oct. 31, 1991

[87] PCT Pub. No.: WO91/11729
PCT Pub. Date: Aug. 8, 1991

[30] Foreign Application Priority Data
Jan. 25, 1990 [JP] Japan ................ 2-13493

[51] Int. Cl.$^5$ ............................. H01L 43/00
[52] U.S. Cl. ........................ 338/32 R; 338/306; 324/249
[58] Field of Search ........ 338/32 R, 306, 307, 338/314; 324/207.21, 249-252; 264/61

[56] References Cited

U.S. PATENT DOCUMENTS 4,477,794 10/1984 Nomura et al. ............ 338/32 R

FOREIGN PATENT DOCUMENTS 58-154478 10/1983 Japan .
59-97487 7/1984 Japan .
59-179320 11/1984 Japan .
59-179321 11/1984 Japan .
59-179322 11/1984 Japan .
61-158966 10/1986 Japan .
63-34986 2/1988 Japan .
63-43987 2/1988 Japan .
1-214784 8/1989 Japan .

Primary Examiner—Marvin M. Lateef
Attorney, Agent, or Firm—Finnegan, Henderson, Farabow, Garrett & Dunner

[57] ABSTRACT

A magnetoresistive sensor includes a magnetic field detecting portion composed of a ferromagnetic thin film formed on one side of an insulating rectangular substrate, at least two terminal electrode portions and wiring portions. In the magnetoresistive sensor, the surface level of at least two corner portions is lower than that of the surface portion of the substrate other than at least two corner portions on the one side of the substrate, the at least two terminal electrode portions are separately formed at the corner portions having the lower surface level and the magnetic field detecting portion composed of the ferromagnetic thin film is formed on a portion of the surface of the substrate other than the at least two corner portions. In the magnetoresistive sensor, the terminal electrode portions are formed on the corner portions of the substrate whose level is lower than that of the surface on which the magnetic field detecting portion is formed and accordingly, when a resin mold is applied for the purpose of reinforcing the bonded portions, the resin mold can be formed such that the surface level of the molded portion is almost equal to that of the surface on which the magnetic field detecting portion is formed.

18 Claims, 23 Drawing Sheets

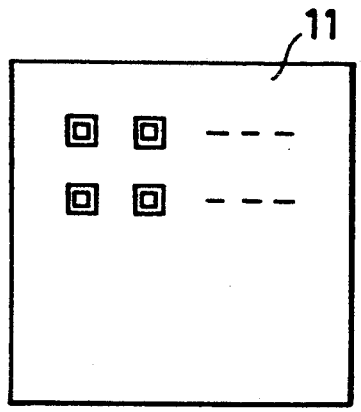
FIG.10A  FIG.10B
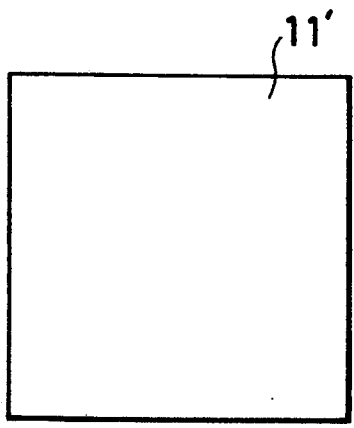
FIG.11A  FIG.11B

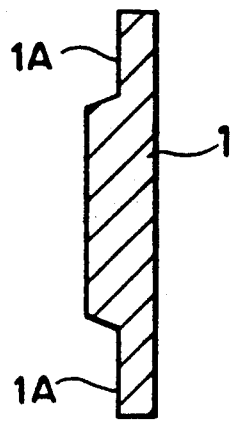
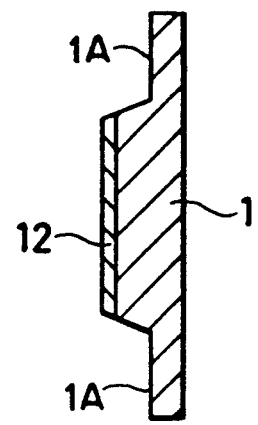
FIG. 12A    FIG. 12B
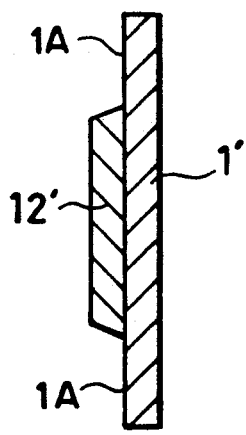
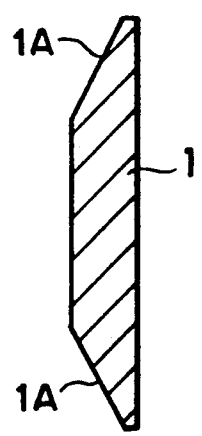
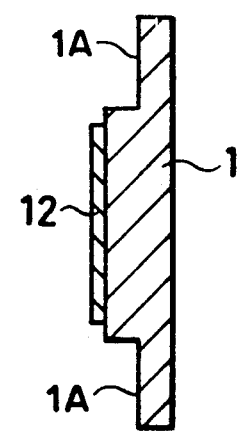
FIG. 12C    FIG. 12D    FIG. 12E

_5,227,761_

MAGNETORESISTIVE SENSOR

TECHNICAL FIELD

The present invention relates to a magnetoresistive sensor having a ferromagnetic thin film and for use in, for instance, a capstan motor for video cassette recorders (VCR) and a magnetic encoder.

BACKGROUND ART

Recently, a magnetoresistive sensor having a ferromagnetic thin film has been used for an accurate control of a magnetic encoder or an accurate control of a capstan motor for VCR and it has been necessary to use such a sensor for controlling a motor with high accuracy. FIG. 1 is a schematic cross sectional view of a capstan motor for VCR in which a conventional magnetoresistive sensor is incorporated. In this capstan motor shown in FIG. 1, reference numerals 16, 17 and 10' respectively represent a rotor yoke, a rotor magnet and a frequency-generating magnet (FG magnet) in which N poles and S poles are alternatively magnetized at small pitches and these elements constitute a rotor part. Reference numeral 18 stands for a stator coil for driving the motor and reference numeral 19 represents a case. Reference numeral 15 represents a magnetoresistive sensor which is fixed to a holder 15H made of a resin. The magnetic field detecting portion 15S is arranged facing the FG magnet 10' normally at a distance of about 100 μm, and thus, the rotation control of the motor is performed by the output signal from the magnetoresistive sensor. Reference numeral 7 stands for a lead portion of the magnetoresistive sensor for electrically connecting the magnetoresistive sensor 15 and a printed circuit board 20.

The FG magnet is in general magnetized at small pitches, and correspondingly, the intensity of the generated magnetic field is small. For this reason, a desired output cannot be obtained if the gap between the magnetoresistive sensor 15 and the FG magnet 10' is large. FIG. 2A shows a plan view of a conventional magnetoresistive sensor before it is attached to the holder made of resin, and FIG. 2B shows a sectional view thereof taken along the line A—A of FIG. 2A. Reference numerals 15S, 15M and 7 represent a magnetic field detecting portion of the magnetoresistive sensor 15, a molded portion for reinforcing lead-bonding portion and a lead, respectively. In the structure as shown in FIGS. 2A and 2B, the electrical connection between the lead and the sensor pellet is usually performed through the bonding with a solder. Moreover, an electrical short often arises and the lead is sometimes peeled off from the lead-bonding portions when they are in the exposed state. Thus, the bonding portions are reinforced by molding for the purpose of eliminating such inconvenience. The reinforcement of the bonding portions are in general performed with the aid of a resin such as epoxy resin and the thickness of the resin must be more than the thickness of the lead, and more specifically, it must be 200 μm or thicker.

This sensor is arranged facing the FG magnet 10, which produces the magnetic field signals, as shown in FIG. 3A. Then, the minimum gap between the magnetic field detecting portion 15S and the surface of the FG magnet 10 becomes greater than 200 μm even if the molded portion with a resin approaches the magnet to such an extent that the portion almost comes in contact with the latter. Recently, motors have been miniaturized and made highly precise, and correspondingly, the pitch of magnetization of the FG magnet has become smaller, hence, the intensity of the magnetic field produced by such a magnet has a very small value. Therefore, the desired output signal from the sensor cannot be obtained, as has been described above, if the gap between the magnetic field detecting portion 15S and the FG magnet 10 is as much as 200 μm. As has been discussed above, a desired value of output signal from the sensor cannot be obtained unless the gap is in the order of 100 μm or smaller.

For this reason, in the conventional technology as shown in FIG. 3B, an element is arranged so that a molded portion 15'M is kept away from the FG magnet 10. However, if the element is arranged in such a manner, a larger space is required below the rotor for avoiding the contact of the molded portion with the rotor. Therefore, this makes it difficult to reduce the thickness of the motor. In order to obtain the maximum output signal of the magnetoresistive sensor, it is necessary to face the entire region of the magnetic field detecting portion 15'S to the magnetized surface of the rotor. In general, it is sometimes observed that the rotor is shifted up and down during rotation in the order of about several hundreds of micrometers. Accordingly, to prevent the reduction in the output of the sensor, it is inevitable to keep a large distance between the lower end of the magnetic field detecting portion 15'S and the upper end of molded portion 15'M reinforced with a resin because the magnetic field detecting portion and the magnetized surface always face each other even if the rotor position shifts up and down. This would be a major obstacle in the miniaturization of the sensor element.

Another conventional magnetoresistive sensor is disclosed in Japanese Utility Model Application Laying-open No. 158966/1986. FIG. 4A is a plan view thereof and FIG. 4B is a sectional view taken along the line A—A in FIG. 4A. As shown in FIG. 4B, this sensor is designed such that a terminal electrode portion 21T is formed on a lower portion of a linear step formed on a silicon substrate 21. Reference numerals 21S, 21M and 6 represent, respectively, a magnetic field detecting portion, a molded portion and a wiring portion for electrically connecting the terminal electrode portion 21T and a lead 7. By making the step larger, this sensor can be designed such that the resin molded surface is not projected over the level of the surface on which the magnetic field detecting portion is formed, unlike the foregoing conventional sensor, even when the terminal portion is reinforced through molding with a resin. If the sensor is designed so as to have such a construction, the distance between the magnetic signal source such as an FG magnet and the surface of the sensor, or the position at which the sensor is to be arranged can arbitrarily be established without the restrictions observed in the conventional ones explained with reference to FIGS. 3A and 3B.

First, the production of an element having such a structure requires extra steps to make the linear or band-like portion before processing a substrate and subsequently, the element is prepared. In addition, it is very difficult to practically produce an element having such a structure because of the following problems. A first problem relates to the structure of the substrate. The band-like stepped portion must have a difference of level in the order of at least 200 μm for limiting the surface of the molded portion to a level lower than that of the surface on which the magnetic field detecting portion is formed. As a specific example, Japanese Utility Model Application Laying-open No. 158966/1986 discloses that the stepped portion may be formed by etching an Si substrate. However, the formation thereof is very difficult. Such a stepped portion cannot be obtained through only one run of etching, and thus, it is necessary to repeat such an etching process over several tens of times. In other words, the etching process must be repeated over many times, and accordingly, the resulting substrate would be very expensive when taking the cost for the production thereof into consideration.

Another problem is the difficulty in processing a substrate. In particular, it is very difficult to carry out the phololithographic process and it is impossible to obtain a pattern with high accuracy. When it is intended to prepare the sensor element having a band-like stepped portion as shown in FIG. 4B, a terminal electrode portion must be formed on the lower portion of the stepped portion. However, with a large difference of level, it is impossible to form a pattern on the band-like portion of the lower step through the photolithographic process. Therefore, a sufficient mass-production and productivity cannot be ensured. Moreover, as the terminal electrode portion cannot be formed through the phololithograph process, a fine terminal pattern cannot be formed with high accuracy. Hence, the distance between the terminals and the size thereof are increased. Correspondingly the size of the sensor element is also increased. On the other hand, if the width of the sensor element is reduced, this conventional sensor element having the foregoing structure suffers from the problems of electrical short arising between the terminals and of the contact with the bonded wires since terminal electrode portions are present on the same line (or band).

As has been explained above, there has not been a proposal of an element having a structure in which the surface of the molded portion is not projected over the level of the surface on which the magnetic field detecting portion is formed, which can effectively be mass-produced, connected through the wire bonding technique, and has high reliability.

DISCLOSURE OF THE INVENTION

An object of the present invention is to solve the problems explained above and to provide a magnetoresistive sensor which is not adversely affected due to the projection of the mold on terminal portions, in which the distance between the surface of a magnetic signal source as an FG magnet and the magnetic field detecting portion of a sensor as well as the position at which the sensor is arranged, can be freely established. In other words, a magnetoresistive sensor is provided in which the lead-taking out portion is not an obstacle in the detection of magnetic signals.

Another object of the present invention is to provide a magnetoresistive sensor which has a structure whose electrical connection between terminal electrode portion of an element pellet and a lead can be performed through the wire-bonding method capable of ensuring high heat resistance and high reliability, and which can be produced according to a wafer process capable of achieving mass-production.

According to one aspect of the present invention, the magnetoresistive sensor, including a magnetic field detecting portion having a ferromagnetic thin film substrate, at least two terminal electrode portions and wiring portion respectively formed on one rectangular surface, includes:

on the one surface of the substrate, the surface level of at least two corner portions is lower than that of the portion at the substrate other than the at least two corner portions, the at least two terminal electrode portions are formed one by one at the corner portions having the lower surface level, respectively, and the magnetic field detecting portion including the ferromagnetic thin film is formed of a portion on the surface of the substrate other than the at least two corner portions.

The foregoing at least two corner portions on the surface of the substrate may have stepped portions so that the surface level thereof is lower than the level of the other surface portion, or alternatively, the surface of the at least two corner portions may be inclined with respect to the other surface portion so that the surface level thereof is lower than the level of the other surface portion.

The external shape of the substrate may be a regular square.

The longitudinal direction of the sensor pattern of the magnetic field detecting portion may be formed parallel to a diagonal line of the regularly square substrate.

The terminal electrode portions for input and output may be formed on symmetrical positions with one another with respect to the center of the surface of the substrate.

On the surface of the substrate, the level of the corner portions on which the terminal electrode portions are formed may be at least 50 $\mu$m lower than that of the portion on the substrate on which the magnetic field detecting portion is formed.

On one side of the substrate, the level of a part of the peripheral portion other than the corner portions may be lower than that of the surface on which the magnetic field detecting portion is formed.

An electrical resistance element may be formed, and further, other functional elements may also be formed on the surface of the substrate.

According to another aspect of the present invention, a magnetoresistive sensor includes:

a magnetoresistive sensor substrate in which, on one surface of the substrate, the surface level of at least two corner portions is lower than that of a portion of the surface of the substrate other than the at least two corner portions, at least two terminal electrode portions separately formed at the corner portions having the lower level respectively, a magnetic field detecting portion includes a ferromagnetic thin film is formed on the portion of the surface of the substrate other than the at least two corner portions, and a magnetic signal processing part includes an integrated circuit element disposed on a semiconductor substrate.

In the magnetoresistive sensor according to the present invention, the terminal electrode portions are formed at the corner portions on the substrate whose level is lower than that for the surface on which the magnetic field detecting portion is formed. Accordingly, it is easy to miniaturize the element and when a resin mold is applied for the purpose of reinforcing the bonded portions, the resin mold can be formed so that the surface of the molded portion is almost equal to that of the surface on which the magnetic field detecting portion is formed.

Moreover, the wire bonding technique can be adopted in the sensor of the present invention and, therefore, the sensor element having high reliability can be produced at low cost.

BRIEF DESCRIPTION OF THE DRAWINGS

FIGS. 10A and 10B are a plan view and a sectional view showing a ceramic green sheet through which holes are made, respectively;

FIGS. 11A and 11B are a plan view and a sectional view showing a plate-like ceramic green sheet, respectively;

FIGS. 12A to 12E are sectional views for illustrating the structure of a substrate (corresponding to one chip) which can be used for fabricating the magnetoresistive sensor according to the present invention;

BEST MODE FOR CARRYING OUT THE INVENTION

The present invention will be explained with reference to the attached drawings.

In the following description, the term "magnetoresistive sensor" means one in which terminals are electrically connected to lead portions and desired portions are molded, and the term "magnetoresistive sensor pellet" means a principal component which functions as a magnetoresistive sensor. Accordingly, the magnetoresistive sensor and the magnetoresistive sensor pellet are considered as being identical with one another in the embodiments according to the present invention.

EMBODIMENT 1

Figures 5A, 5B, 5C:
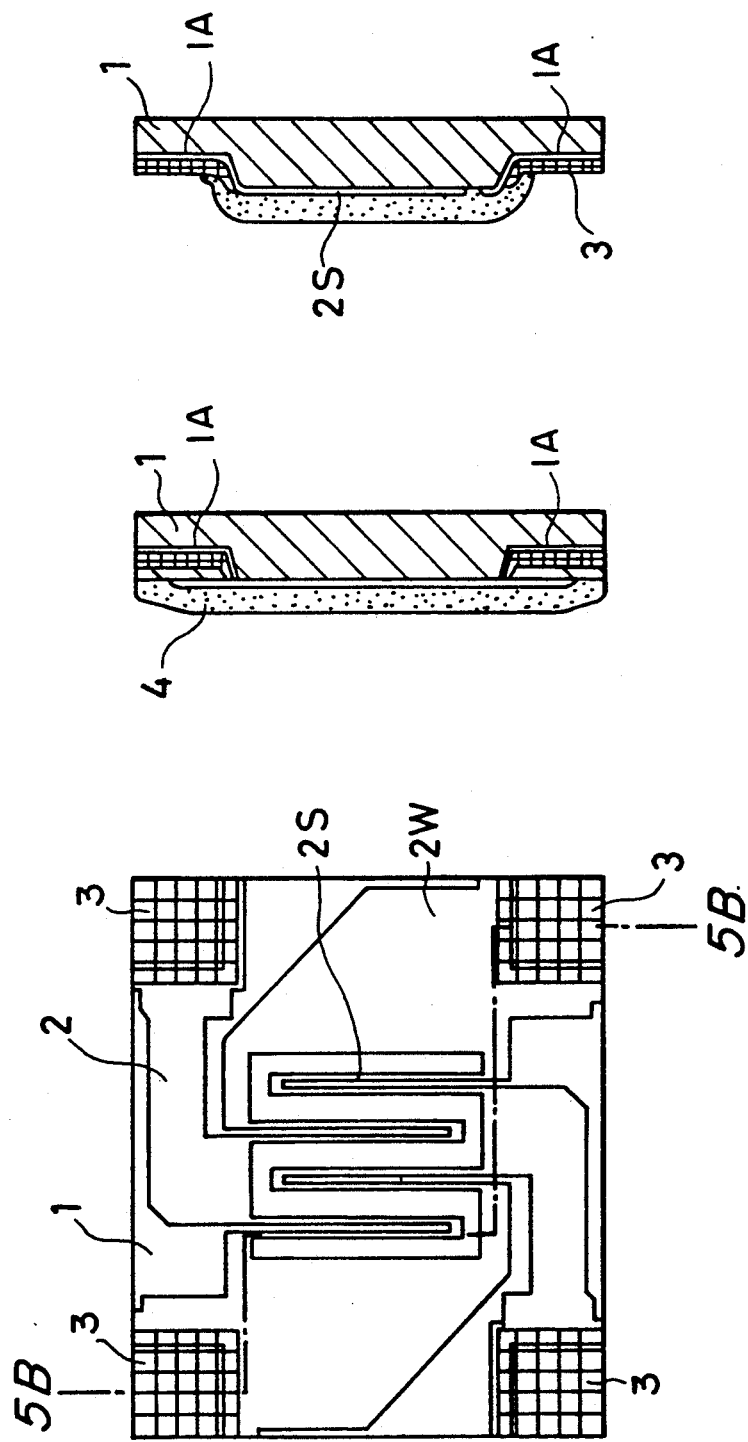
FIGS. 5A, 5B and 5C are, respectively, a plan view, a side view and a sectional view taken along the line A—A in FIG. 5A for illustrating a first embodiment of the magnetoresistive sensor pellet according to the present invention.

FIG. 5A is a plan view of a magnetoresistive sensor pellet which is a principal component of the magnetoresistive sensor according to the first embodiment of the present invention, FIG. 5B is a side view thereof, and FIG. 5C is a sectional view taken along the line A—A in FIG. 5A. This embodiment relates to a magnetoresistive sensor pellet with four terminals which comprises an insulating rectangular substrate 1 made of ceramic such as alumina having rectangular recesses 1A at the four corners.

Reference numeral 2 represents a ferromagnetic thin film of, for instance, an iron-nickel alloy (Fe-Ni), 2S a magnetic field detecting portion, 2W wiring portions, 3 terminal electrode portions formed in the recesses 1A and 4 a passivation film. The sensor pattern of the magnetic field detecting portion in this sensor pellet is formed such that the longitudinal direction of the pattern is parallel to the side of the pellet. Further, in this embodiment, patterns of the wiring portions 2W are formed symmetrically. In other words, they are designed to have a structure such that any offset voltage is hardly generated. As shown in FIG. 5A, the width of the wiring portions 2W is larger than that of the magnetic field detecting portions 2S.

The method for manufacturing this embodiment will now be described below.

Figures 6A, 6B:
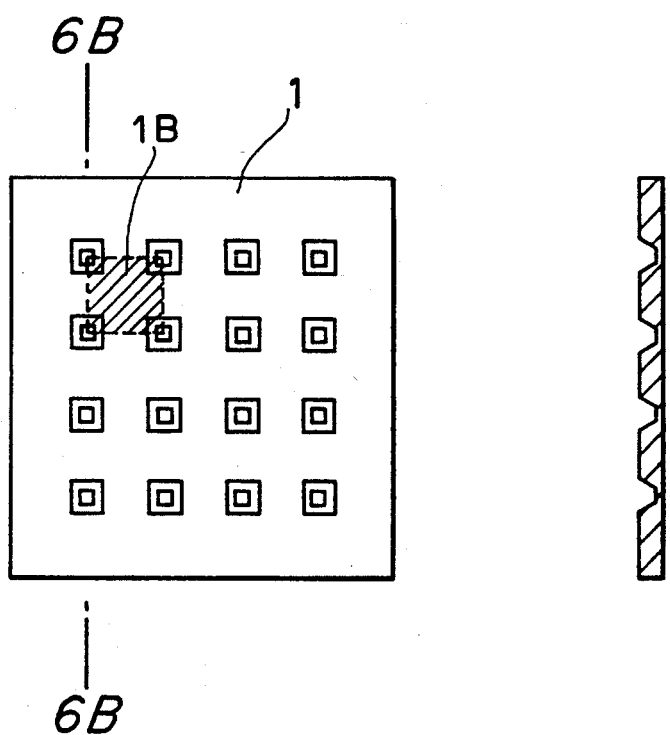
FIG. 6A is a plan view of the structure of a substrate prior to the production of the first embodiment of the magnetoresistive sensor according to the present invention.
FIG. 6B is a cross sectional view taken along the line A—A in FIG. 6A.

FIGS. 6A and 6B show the structure of a substrate prior to the production of the element according to this embodiment. FIG. 6A is a plan view of the substrate. In FIG. 6A, the shadowed region 1B enclosed with broken lines corresponds to the region of one unitary sensor pellet. FIG. 6B is a sectional view taken along the line A—A in FIG. 6A. The recessed structure on the substrate is formed by depressing a metal mold against a green sheet with a flat surface prior to firing thereof during the processes for producing the ceramic substrate so that each step has a difference in level in the order of 200 $\mu$m. The ferromagnetic material such as an Fe-Ni alloy which shows a magnetoresistive effect was deposited on the whole surface of the substrate to thus obtain a ferromagnetic thin film (FIG. 5A). Subsequently, a photoresist pattern was formed onto the substrate according to the photolithography technique so that the surface of the substrate other than the recessed portions shown in FIG. 6A was covered and terminal electrode portions 3 (FIG. 5A) were formed on the recessed portions according to plating means or vapor deposition technique for example. In this respect, the most upper layer was formed from a material which makes it possible to perform wire bonding with, for instance, gold (Au). Thereafter, photoresist patterns for the magnetic field detecting portions 2S and the wiring portions 2W were again formed according to the photolithography technique and then the unnecessary portions thereof were removed by etching to thus form a sensor pattern. The desired portion was covered with a passivation film 4. Then, the resulting product was cut into unitary sensor pellets (chips), i.e., sensor pellets, each corresponding to the shadowed region 1B as shown in FIG. 6A with a cutting means such as dicing. As has been described above, the magnetoresistive sensor according to the present invention can be produced while applying the usual semiconductor processes.

Figure 1:
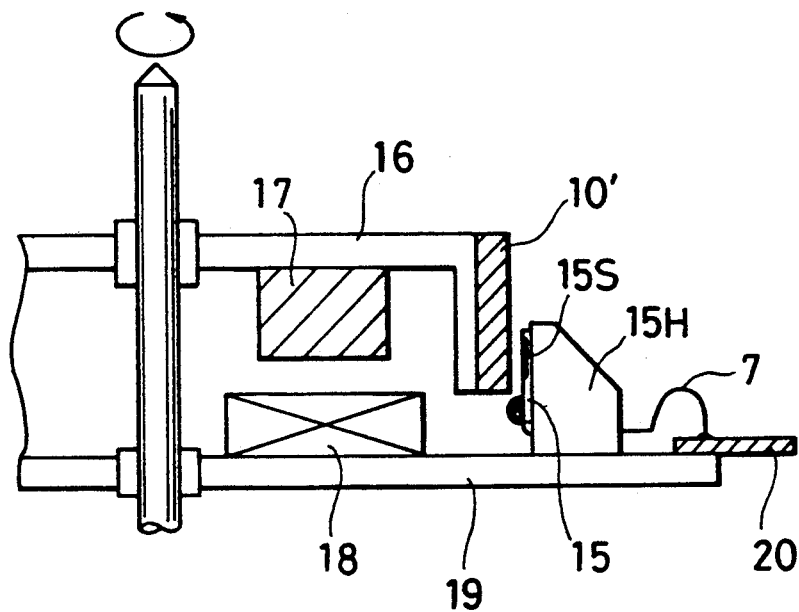
FIG. 1 is a schematic sectional view of a motor for VCR in which a conventional magnetoresistive sensor is incorporated.
Figures 2A, 2B:
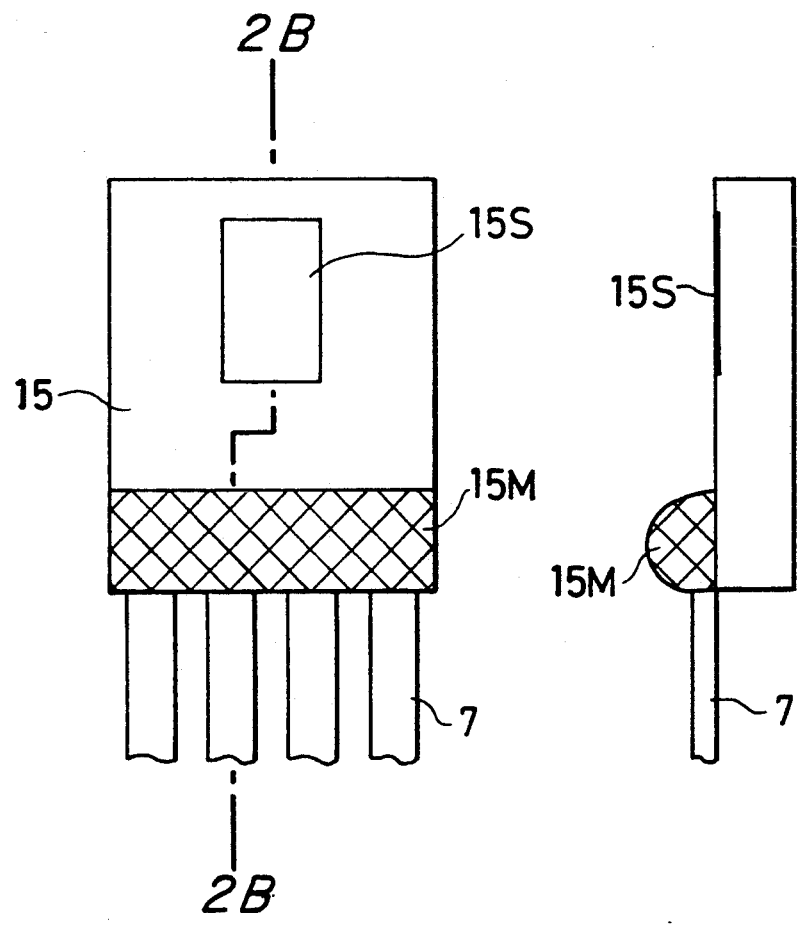
FIGS. 2A and 2B are a plan view and a sectional view of a conventional magnetoresistive sensor, respectively.
Figure 3A:
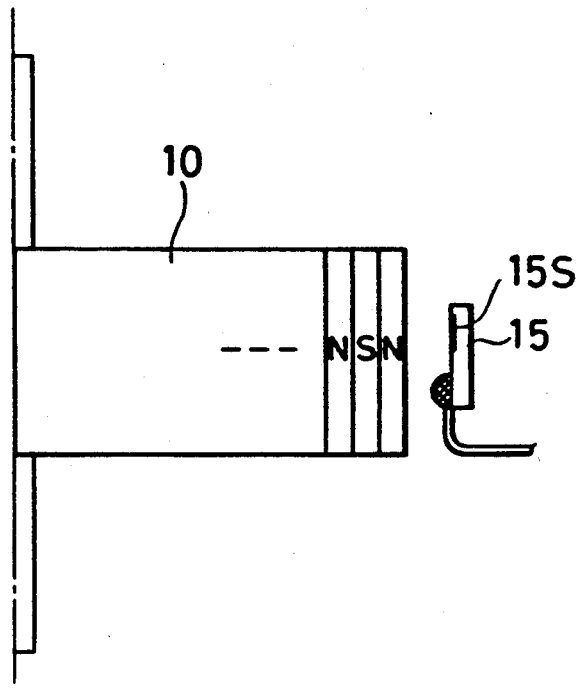
FIGS. 3A and 3B are, respectively, sectional views, each illustrating a condition in which a conventional magnetoresistive sensor and the surface of a rotor face one another.
Figure 3B:
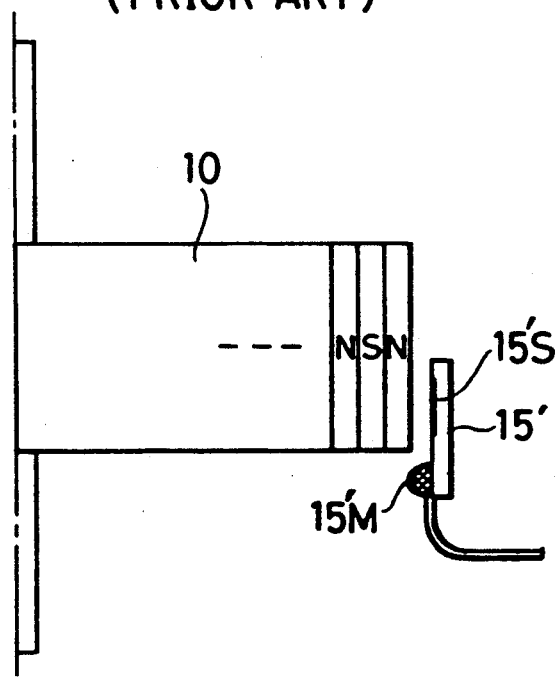
Figure 7A:
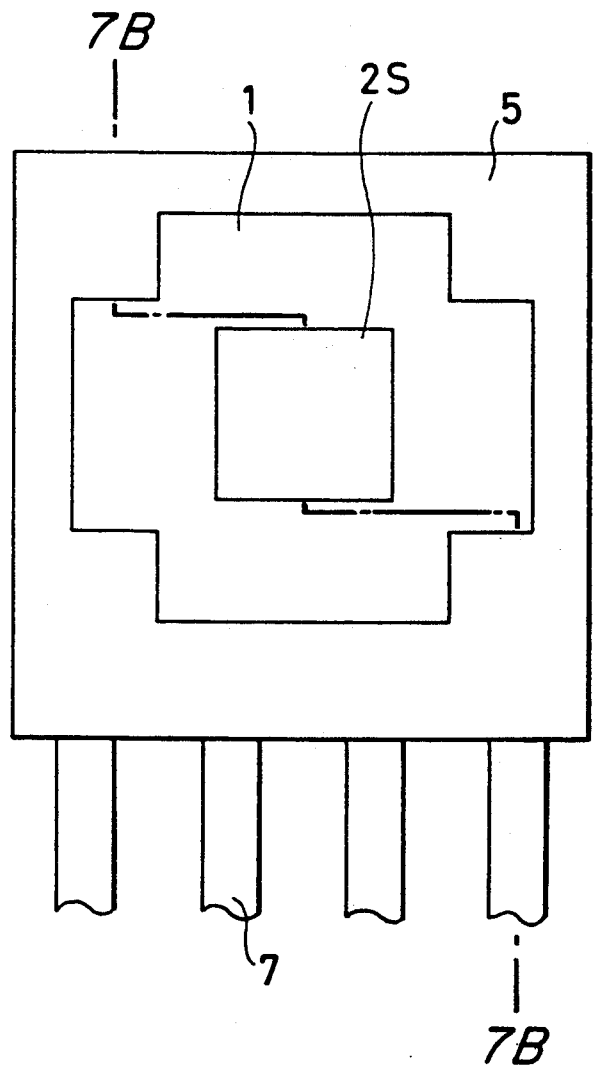
FIG. 7A is a plan view showing the first embodiment of the magnetoresistive sensor according to the present invention which is subjected to the wire bonding and the transfer molding thus forming a final element.
Figure 7B:
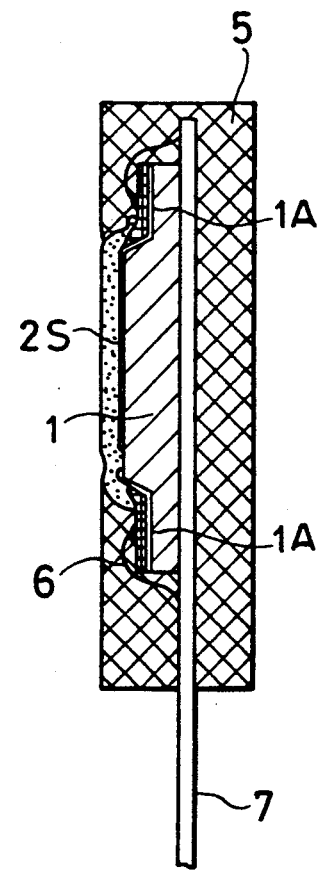
FIG. 7B is a sectional view taken along the line A—A in FIG. 7A.

FIGS. 7A and 7B show an element obtained by fixing the magnetoresistive sensor pellet shown in FIG. 5A to a lead frame through die bonding, electrically connecting terminals of the sensor pellet with a lead by bonding with an Au wire 6, and subjecting the connected element to transfer molding with a thermoset epoxy resin 5. FIG. 7A is a plan view thereof and FIG. 7B is a sectional view taken along the line A—A in FIG. 7A. In this case, the structure of the pellet was formed in such a manner that terminal electrode portions for input and output and the sensor patterns are formed in a 180° point symmetrical relation as shown in FIGS. 5A and 5B. For this reason, the fixing of the pellet through the die bonding can be performed according to two ways. In other words, a pattern having a certain orientation is geometrically identical with a pattern which is obtained by rotating the former at an angle of 180°. Thus, if the fixing through the die bonding is performed in either of the orientations to prepare a sensor element, the resulting element makes it possible to detect the same magnetic signal source and to give the same output signal. Moreover, in the element having such a structure, the sensor pellet and the lead 7 are electrically connected through a wire 6 and, therefore, the element has very high reliability in "test for heat resistance during soldering". The following table 1 shows the results (variation in properties) obtained by examining the embodiment of the element according to the present invention and the comparative embodiment which was obtained by bonding with a solder as shown in FIG. 2B through the "test for heat resistance during soldering" which was performed at 260° C. for 30 seconds. The element according to the present invention never caused any change in its properties even after the test.

TABLE 1

|  | Change in Resistance (%) | Change in Sensitivity (%) |
|---|---|---|
| Embodiment of the Invention | ±0.2 | ±0.6 |
| Comparative Embodiment | ±2.5 | −9.3 |

In addition, the element as shown in FIGS. 7A and 7B in which the electrical connection is performed by the wire bonding has a structure suitable for automatic production inclusive of the molding process to thus simplify the manufacturing processes. Thus, such a structure makes it possible to reduce the production cost thereof since the element has very high reliability and can be assembled with high efficiency as compared with those obtained by assembling through bonding with a solder.

In order to make the surfaces divel of the magnetic field detecting portion identical with that for the molded resin surface as shown in FIG. 7B, the difference in level between the terminal electrode portions and the other portion on a substrate must be at least 50 $\mu$m while taking the height of the wire and the accuracy of the metal mold for molding into consideration. The practical difference in level is preferably not less than 100 $\mu$m and more preferably, not less than 200 $\mu$m.

When the transfer molding is performed, the surface of the magnetic field detecting portion may be pressed against the surface of the metal mold for the purpose of exposing the surface of the sensor. In such a case, a resin such as a polyimide, a photosolder resist, or a solder mask resist may further be coated on the passivation film 4 for preventing surface breakage of the magnetic field detecting portion.

Figure 8:
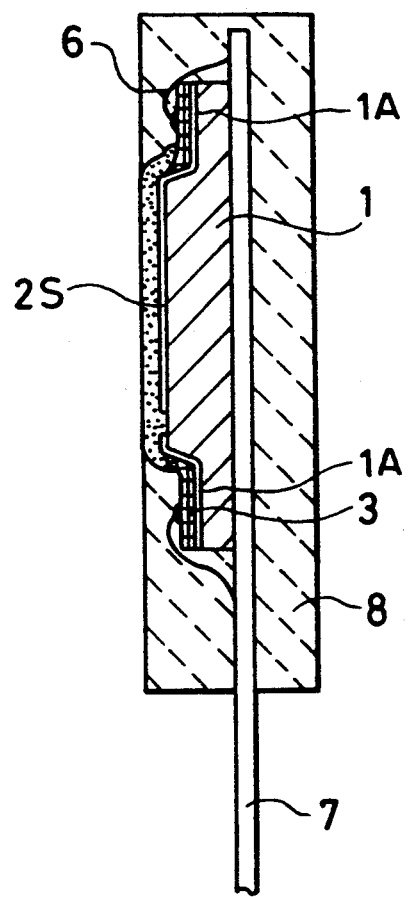
FIG. 8 is a sectional view for showing the first embodiment of the magnetoresistive sensor pellet according to the present invention which is subjected to the wire bonding and the injection molding thus forming a final element.

FIG. 8 shows a section of an element which is molded with a thermoplastic resin 8 through the injection molding. In rationalizing the assembly or the like, the foregoings may apply to this case. As to the heat resistance during soldering, this element is unfavorable as compared with the thermosetting resin used in the transfer molding, but this problem can be solved by the use of a resin having high heat resistance such as polyphenylene sulfide or polybutylene terephthalate.

Figure 9:
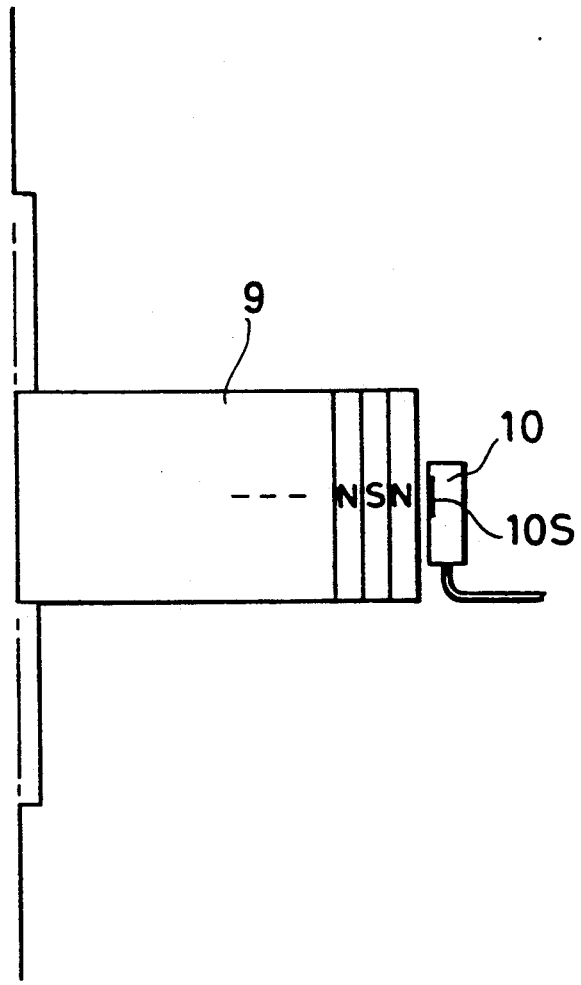
FIG. 9 is a sectional view for illustrating a condition in which the surface of a rotor and the element shown in FIG. 7B or FIG. 8 face each other.

FIG. 9 shows a condition in which the magnetoresistive element 10 having a structure as shown in FIG. 7B or FIG. 8, and an FG magnet 9 facing each other. Since the surface of the resin mold and the magnetic field detecting portion 10S can be formed such that the level of the former is approximately equal to that for the latter, the miniaturization of the element can be ensured. Moreover, it is not necessary to secure any space below the rotor for avoiding the contact with the projected portion of the molded resin. This serves to reduce the thickness of the motor.

The following Table 2 shows the ratio of the smallest required area for the sensor pellet according to the embodiment of the present invention to that for the comparative element as shown in FIG. 2B when these elements are designed to have the same electrical properties. As seen from the results listed in Table 2, the present invention can reduce the size of the sensor pellet to not more than ⅓ time that for the conventional one.

TABLE 2

|  | Size of Sensor Pellet | Area Ratio |
|---|---|---|
| Embodiment of the Invention | 2 mm × 2 mm | 1 |
| Comparative Embodiment | 3 mm × 4 mm | 3 |

Figures 4A, 4B:
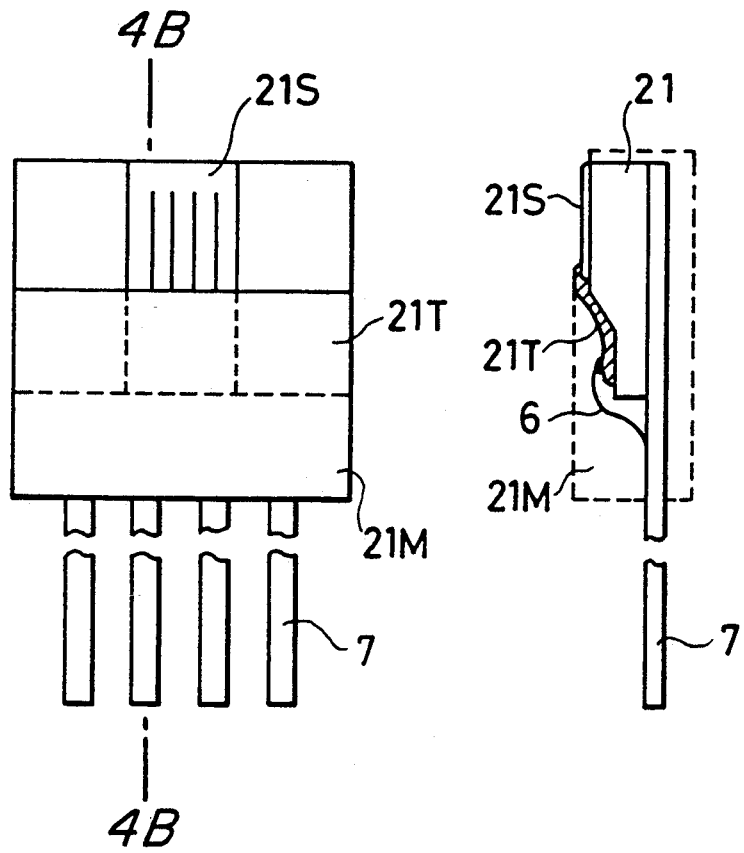
FIG. 4A is a plan view of another conventional magnetoresistive sensor.
FIG. 4B is a sectional view taken along the line A—A in FIG. 4A.

Although it is practically difficult to obtain an element as shown in FIGS. 4A and 4B, the ratio of the size of the sensor pellets becomes greater than that obtained with respect to the foregoing comparative element while taking into consideration large pitches between wiring portions to avoid the electrical short even if the elements are designed to have the same electrical properties.

In this embodiment, the formation of the terminal electrode portions are performed after depositing the ferromagnetic thin film, but it is also possible to form the terminal electrode portions in advance before the deposition of the ferromagnetic material to obtain a ferromagnetic thin film. In other words, there is no restriction in the order of the formation thereof.

In this embodiment, the recessed portions on the substrate are formed by depressing a metal mold against a green sheet of ceramic prior to firing, but there is also no restriction in the method for manufacturing these recessed portions. For instance, a substrate having the same structure can also be obtained by pasting a green sheet 11 of ceramic having holes made at desired pitches, whose plan view and sectional view are shown in FIGS. 10A and 10B, respectively, to a normal plate-like green sheet 11' of ceramic having no hole, whose plan view and sectional view are shown in FIGS. 11A and 11B, respectively, and then firing the resulting assembly. The holes as shown in FIGS. 10A and 10B can be formed easily by pressing a ceramic while it is still in the green sheet state in a metal mold or the like. A ceramic substrate having a structure similar to that shown in FIGS. 6A and 6B can be prepared by pasting this green sheet in which holes are made in the manner explained above to a green sheet with no holes as shown in FIGS. 11A and 11B and then firing the assembly. The recessed portions can also be formed after the firing of the substrate through a means such as a laser processing technique.

FIGS. 12A to 12E show sectional views of substrates which are cut into chips and which can be used in the present invention. FIG. 12A is a sectional view of a ceramic substrate 1 in which a part of a ceramic substrate, i.e., regions 1A, for forming the terminal electrode portions are recessed as exemplified in this embodiment, and FIG. 12B is a sectional view of a ceramic substrate having recessed portions 1A and a glazed layer 12 applied on the surface other than the recessed portions. FIG. 12C is a sectional view of a substrate 1 which is prepared by applying a glazed layer 12' onto the flat surface of a ceramic substrate 1' except for the surface regions 1A for forming the terminal electrode portions to thus project the surface area. FIG. 12D is a sectional view of the structure of a substrate whose regions 1A for forming the terminal electrode portions are tapered. FIG. 12E is a sectional view of the structure of a substrate whose stepped portions are almost vertically formed and in which a glazed layer 12 is applied to the region for forming the magnetic field detecting portion. In order to make the most use of the magnetic properties of the magnetoresistive sensor, the surface roughness of the region for forming the magnetic field detecting portion is desirably as small as possible. Therefore, a glazed layer is preferably applied onto the surface of the region for forming the magnetic field detecting portion as shown in FIGS. 12B, 12C and 12E because of the small surface roughness thereof. However, if the glazed layer is too thick, the surface of the glazed layer is greatly curved. As a result, if such a substrate is processed to form a sensor element, the magnetic field detecting portion is thus formed on a curved surface. In such a sensor element, the gap between a magnetic signal source and the magnetic field detecting portion is not uniform and accordingly, the output signal from the sensor element is also unstable. The glazed surface may be polished in order to eliminate such a disadvantage. Thus, the magnetic field detecting portion can be formed on a flat surface by polishing the glazed surface.

EMBODIMENT 2

Figure 13B:
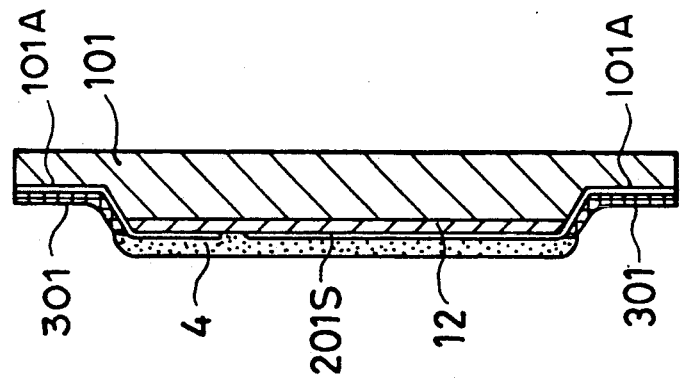
FIG. 13B is a cross sectional view taken along the line A—A in FIG. 13A.
Figure 13A:
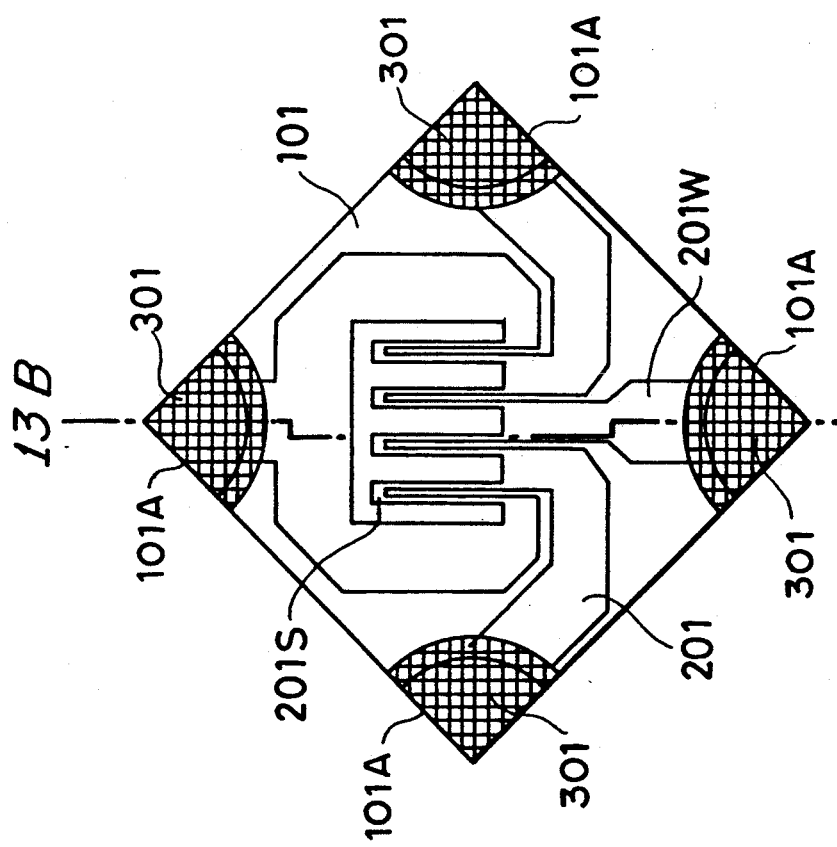
FIG. 13A is a plan view showing a second embodiment of the magnetoresistive sensor according to the present invention.

FIG. 13A is a plan view of a second embodiment of the magnetoresistive sensor pellet according to the present invention and FIG. 13B is a sectional view taken along the line A—A in FIG. 13A. This embodiment relates to a magnetoresistive sensor with four terminals which comprises fan-shaped recesses 101A at the four corners on a regular square substrate 101. In this case, a glazed layer 12 is applied below the magnetic field detecting portion and a substrate having a sectional structure as shown in FIG. 12B is employed. The recesses may have a fan-shaped form as in this embodiment or may have any other shape. Reference numeral 101 represents a ceramic substrate, 201 a ferromagnetic thin film, 201S a magnetic field detecting portion, 201W wiring portions, and 301 terminal electrode portions, respectively. The magnetoresistive sensor pellet of this embodiment can be produced in the same manner used in Embodiment 1 except for the formation of the glazed layer, the shape of the recesses, and the pitches thereof. The glazed layer 12 was formed by coating a glass paste on a ceramic substrate after preparing the same and then firing the coated layer. Moreover, in this case, the sensor pattern of the magnetic field detecting portion is formed such that the longitudinal direction of the pattern is parallel to the diagonal of the regular square substrate. This structure is favorable for elongating the length of the sensor in comparison with that of Embodiment 1. In addition, each of the input terminals, the output terminals or the like are formed symmetrically as in Embodiment 1, and correspondingly, the element can be fixed through the die bonding technique according to two ways as in Embodiment 1. Further, the layout of the wiring portions are also symmetrical as in the case shown in FIG. 5A. This structure is likewise designed so that the offset voltage is not generated.

EMBODIMENT 3

Figure 14:
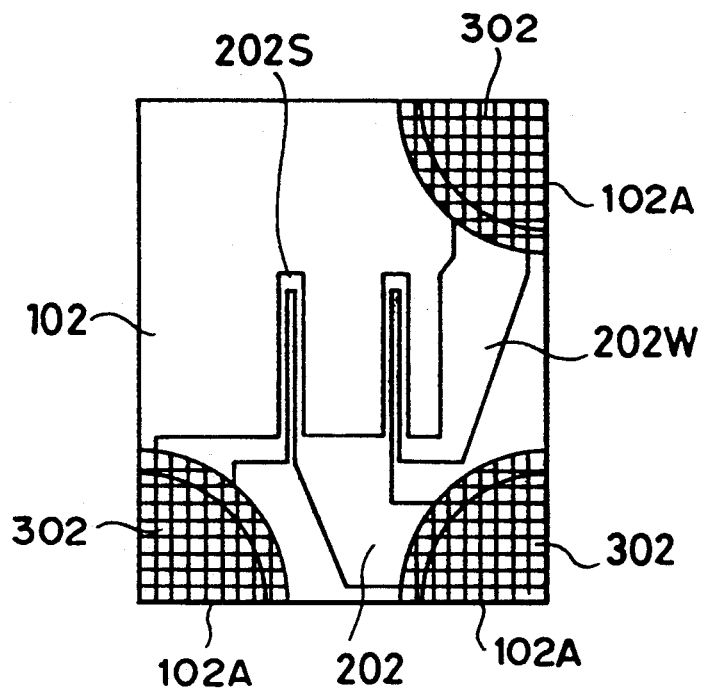
FIG. 14 is a plan view showing a third embodiment of the magnetoresistive sensor according to the present invention.

FIG. 14 is a plan view of a third embodiment which is a magnetoresistive sensor pellet with three terminals which comprises fan-shaped recesses 102A at three corners of the the four corner substrate. This sensor pellet can be produced according to the same manner as used in Embodiment 1 except for the shape of the recess and the pitches formed thereof.

In FIG. 14, reference numeral 102 represents a ceramic substrate, 202 a ferromagnetic thin film, 202S a magnetic field detecting portion, 202W wiring portions and 302 terminal electrode portions. For elements with three terminals, at least three recesses must be formed on the substrate, but the number of recesses may be more than 3.

EMBODIMENT 4

Figure 15:
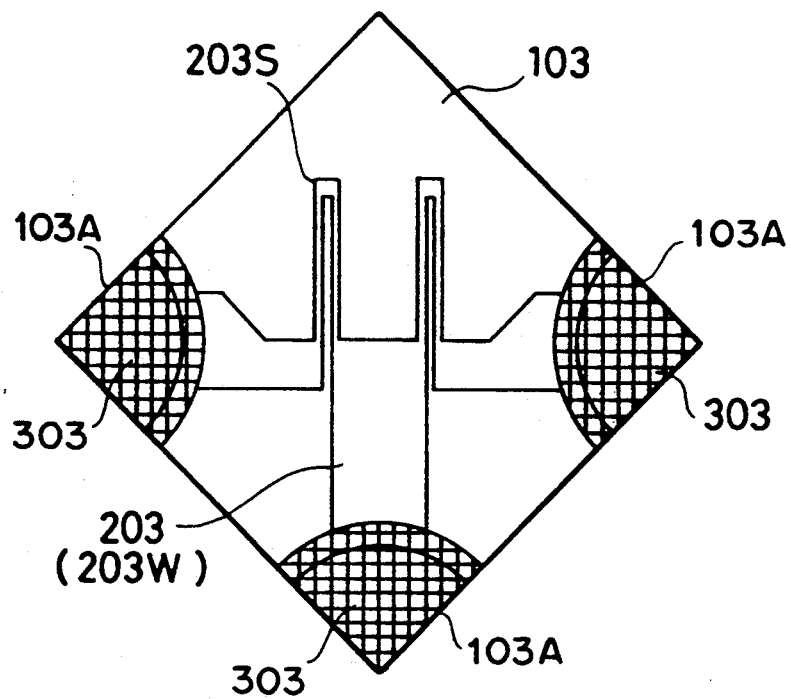
FIG. 15 is a plan view showing a fourth embodiment of the magnetoresistive sensor according to the present invention.

FIG. 15 is a plan view of a fourth embodiment of the magnetoresistive sensor pellet according to the present invention. This embodiment is a magnetoresistive sensor with three terminals in which the sensor pattern is formed such that the longitudinal direction thereof is parallel to the diagonal of a regular square substrate as in Embodiment 2. The element can be produced according to the same method used in Embodiment 1 except for the shape of the recess and the pitches formed thereof.

In FIG. 15, reference numeral 103 represents a ceramic substrate, 103A recessed portions, 203 a ferromagnetic thin film, 203S a magnetic field detecting portion, and 203W wiring portions. Reference numeral 303 stands for terminal electrode portions. When this embodiment is compared with the embodiment shown in FIG. 14, the element has a structure which hardly causes the offset voltage from the viewpoint of its design since the layout of the wiring portions are symmetrical.

The offset voltage is preferably as low as possible from the practical point of view. Therefore, the shape shown in FIG. 15 is more preferred than that shown in FIG. 14 so far as the element with three terminals is concerned.

EMBODIMENT 5

Figure 16:
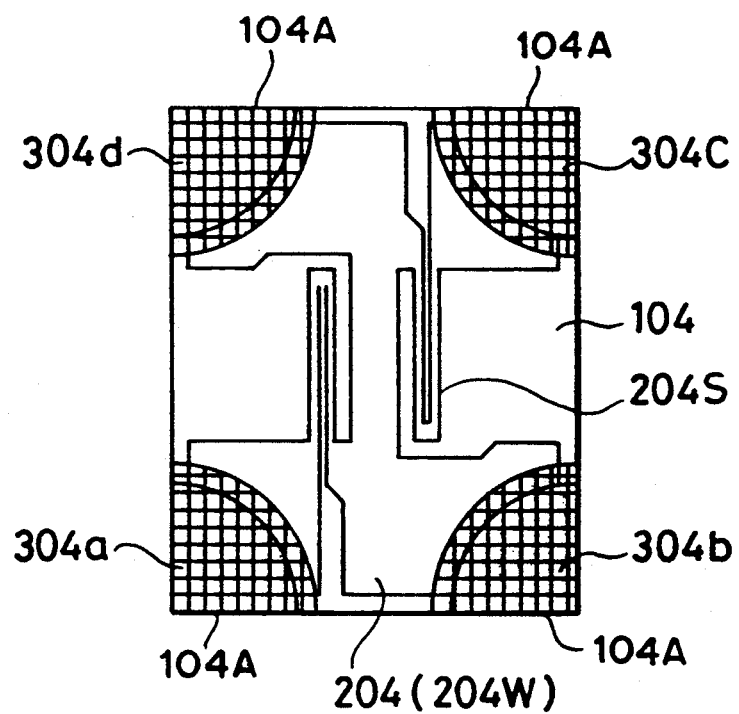
FIG. 16 is a plan view showing a fifth embodiment of the magnetoresistive sensor according to the present invention.

FIG. 16 is a plan view of a fifth embodiment of the magnetoresistive sensor pellet according to the present invention. This embodiment relates to a magnetoresistive sensor with four terminals having single-phase output signal which comprises terminal electrode portions formed at the four corners of a substrate and has a point symmetrical pattern. In FIG. 16, reference numeral 104 represents a ceramic substrate, 104A recessed portions, 204 a ferromagnetic thin film, 204S a magnetic field detecting portion, and 204W wiring portions. Reference numerals 304a to 304d each represents a terminal electrode portion.

In the pellet shown in FIG. 16, input terminals and output terminals each are disposed on the diagonal of the rectangular substrate. Reference numerals 304a and 304c represent the input terminals. The output terminals represented by 304b and 304d are electrically connected through the common wiring portion so that the same output signal can be obtained through either of the terminals. As has been explained above, the input terminals and the output terminals are formed in a 180° point symmetrical relation, respectively, in this element. Accordingly, the degree of freedom for fixing the pellet through the die bonding technique is 2 as in Embodiments 1 and 2.

EMBODIMENT 6

Figure 17:
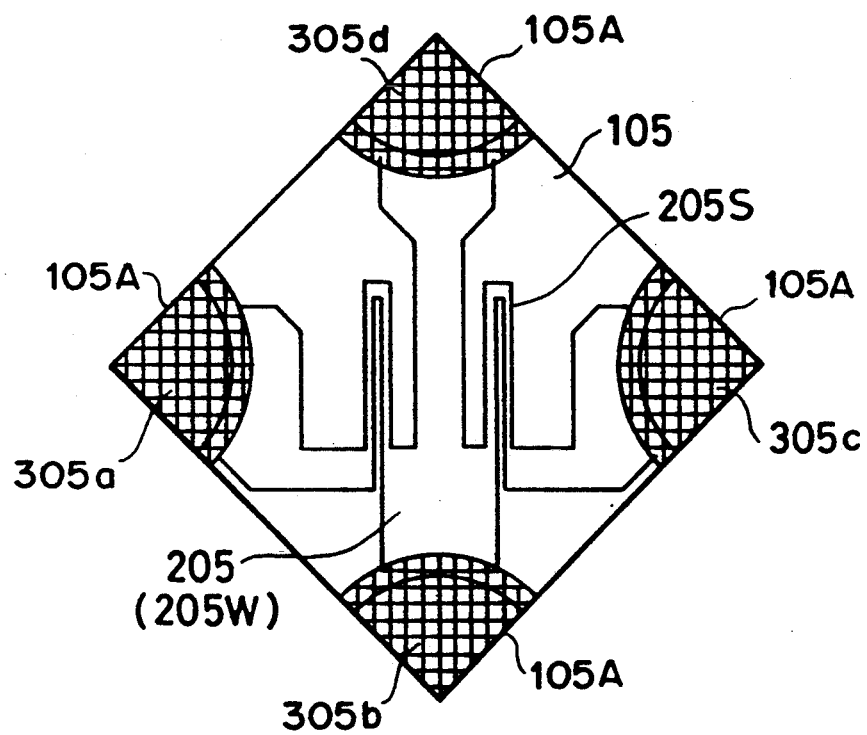
FIG. 17 is a plan view showing a sixth embodiment of the magnetoresistive sensor according to the present invention.

FIG. 17 is a plan view of a sixth embodiment of the magnetoresistive sensor pellet according to the present invention. As in Embodiment 2 or 4, this embodiment comprises a substrate having a regular square appearance and is a magnetoresistive sensor with four terminals having single-phase output signal in which a sensor pattern is formed such that the longitudinal direction thereof is parallel to the diagonal of the regular square substrate.

In FIG. 17, reference numeral 105 represents a ceramic substrate, 105A recessed portions, 205 a ferromagnetic thin film, 205S a magnetic field detecting portion, and 205W wiring portions. Reference numerals 305a to 305d each represents a terminal electrode portion. Reference numerals 305a and 305c represent the input terminals. In this case, the output terminals represented by 305b and 305d are likewise electrically connected through common wiring portion as in Embodiment 5 so that the same output signal can be obtained through either of the terminals. In this case, the input terminals and the output terminals are likewise formed in a 180° point symmetrical relation, respectively. Accordingly, the degree of freedom for fixing the pellet through the die bonding technique is 2 as in Embodiment 5.

EMBODIMENT 7

Figure 18A:
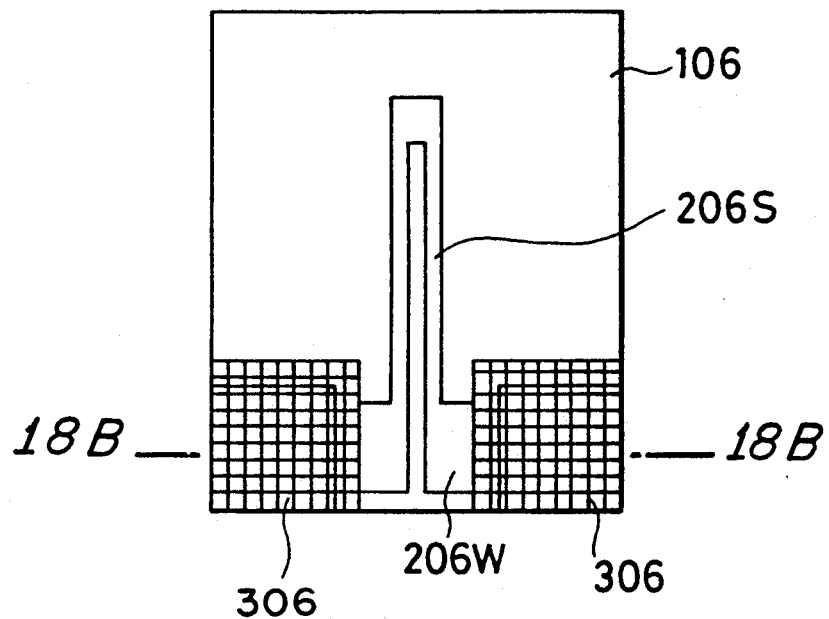
FIG. 18A is a plan view showing a seventh embodiment of the magnetoresistive sensor according to the present invention.
Figure 18B:
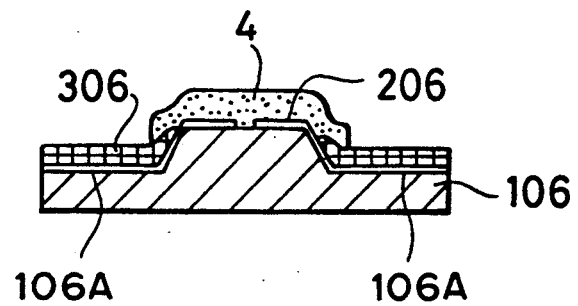
FIG. 18B is a sectional view taken along the line A—A in FIG. 18A.

FIG. 18A is a plan view of the magnetoresistive sensor pellet according to the seventh embodiment of the present invention and FIG. 18B is a sectional view taken along the line A—A in FIG. 18A. This embodiment relates to a magnetoresistive sensor with two terminals which comprises rectangular recesses 106A on two positions among the four corners on the rectangular substrate.

In FIGS. 18A and 18B, reference numeral 106 represents a ceramic substrate, 206 a ferromagnetic thin film, 206S a magnetic field detecting portion, 206W wiring portion, 306 terminal electrode portions disposed on recessed portions, and 4 a passivation film. In this sensor pellet, the sensor pattern is formed such that the longitudinal direction thereof is parallel to one side of the pellet.

Figures 19A, 19B:
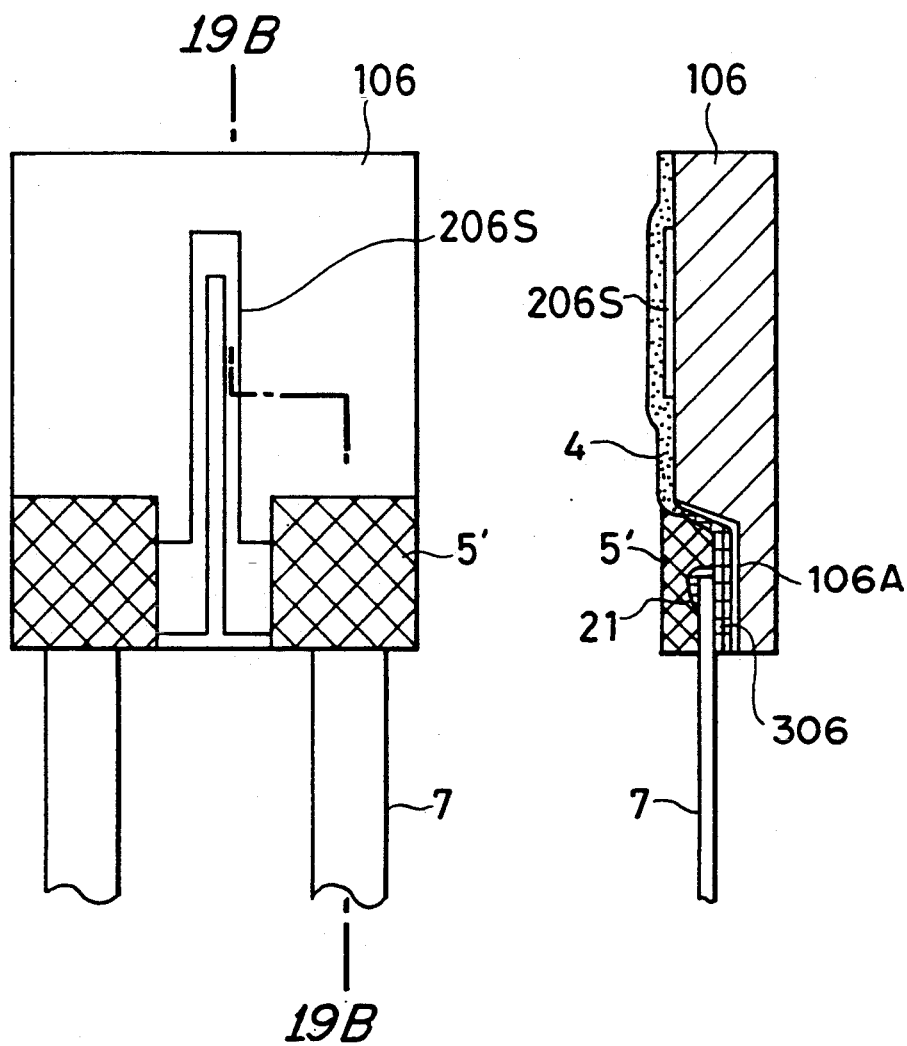
FIG. 19A is a plan view of an element which is obtained to electrically connect on the terminal electrode portions of the magnetoresistive sensor pellet shown in FIGS. 18A and 18B by the lead-bonding with a solder.
FIG. 19B is a sectional view taken along the line A—A in FIG. 19A.

FIG. 19A is a plan view of a magnetoresistive sensor with two terminals obtained by electrically connecting the terminal portions of the foregoing sensor pellet to a lead 7 through bonding with a solder 21. FIG. 19B is a sectional view taken along the line A—A in FIG. 19A. Reference numeral 5' stands for a portion reinforced by molding with resin on a connected portion. In this case, the mold is formed such that the level of the mold surface is approximately equal to that of the magnetic field detecting portion. In this embodiment, even if the connection is performed through the bonding with a solder, the molded surface can be formed so as not to project over the level of the surface on which the magnetic field detecting portion is formed.

In the element with two terminals shown in FIG. 19A, two recessed portions are formed on the two corners of the rectangular substrate, however the recessed portions may be formed on three or four corners on the substrate. Moreover, the recessed portions may also be formed on a peripheral portion in addition to the corners. If a part of the corners of the rectangular substrate is missing, the foregoings may apply in this case, so far as desired recessed portions are formed and the desired terminal electrode portions are formed on the recesses.

EMBODIMENT 8

Figures 20A, 20B:
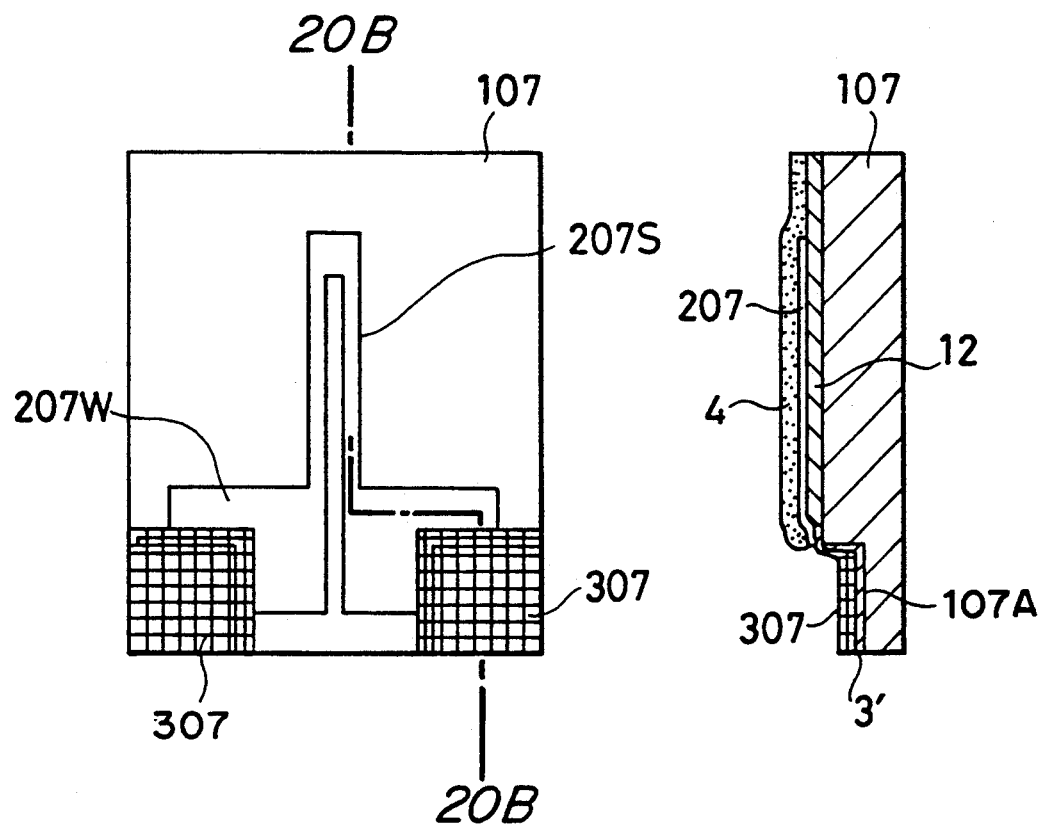
FIG. 20A is a plan view showing an eighth embodiment of the magnetoresistive sensor according to the present invention.
FIG. 20B is a sectional view taken along the line A—A in FIG. 20A.

FIG. 20A is a plan view of an eighth embodiment of the magnetoresistive sensor pellet according to the present invention and FIG. 20B is a sectional view taken along the line A—A in FIG. 20A. This embodiment is a magnetoresistive sensor pellet with two terminals in which the difference of level is almost vertically formed on a substrate as shown in FIG. 12E. In FIGS. 20A and 20B, reference numeral 107 represents a ceramic substrate, 107A recessed portions, 207 a ferromagnetic thin film, 207S a magnetic field detecting portion, and 207W wiring portions. Reference numeral 307 represents terminal electrode portions composed of Au.

In this embodiment, the substrate can be manufactured according to the method used in Embodiment 2 with a minor modification except that for shape of the recessed portions and the pitches formed thereof. Reference numeral 12 stands for a glazed layer. Since the stepped portions are approximately vertically formed on the substrate, it is very difficult to apply a material for electrodes on the side wall of the stepped portions through a means such as vapor deposition. For this reason, a conductive paste 3' is coated on the side wall thereof, then fired. Thereafter a layer of material for electrodes is formed on the side wall by plating and thus, simultaneously forming the terminal electrode portions. The electrodes may be formed by coating a conductive paste and then firing, or by plating alone. Moreover, the materials for electrodes are not restricted to specific ones so far as they are electrically conductive.

As shown in FIG. 20B, if the stepped portions are approximately vertically formed on the substrate, the wiring portions 207W can be shortened, and accordingly, the size of the sensor element can be further miniaturized.

EMBODIMENT 9

Figure 21:
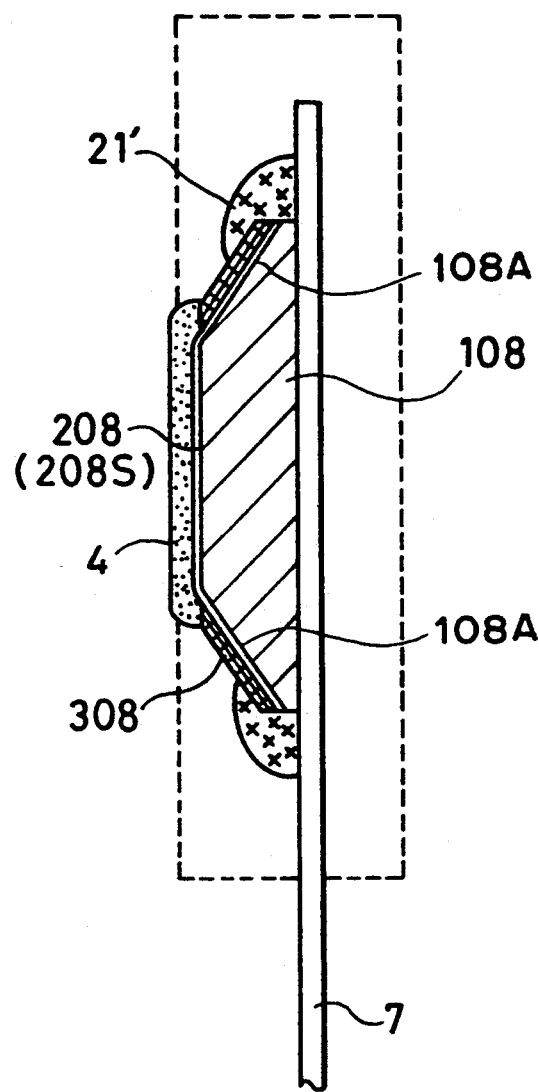
FIG. 21 is a sectional view showing a ninth embodiment of the magnetoresistive sensor according to the present invention.

FIG. 21 is a sectional view of a ninth embodiment of the magnetoresistive sensor according to the present invention. This embodiment relates to a magnetoresistive sensor in which the corners 108A of a substrate are tapered as shown in FIG. 12D. Further, FIG. 21 shows a condition in which the magnetoresistive sensor pellet is electrically connected to a lead 7 by a conductive resin 21'.

The region surrounded by the broken line in FIG. 21 corresponds to the region to be molded with resin when the pellet is formed into a final element. Reference numeral 108 represents a ceramic substrate, 208 a ferromagnetic thin film, 208S a magnetic field detecting portion, and 308 terminal electrode portions.

As has been described above, the corners of the substrate on which the terminal electrode portions are to be formed are tapered. Therefore, the electrical connection between the terminal electrode portion 308 and the lead 7 can be achieved using the conductive resin 21' without using any wires. The materials for the conductive resin 21' is not restricted to specific ones so far as they are electrically conductive.

EMBODIMENT 10

Figure 22:
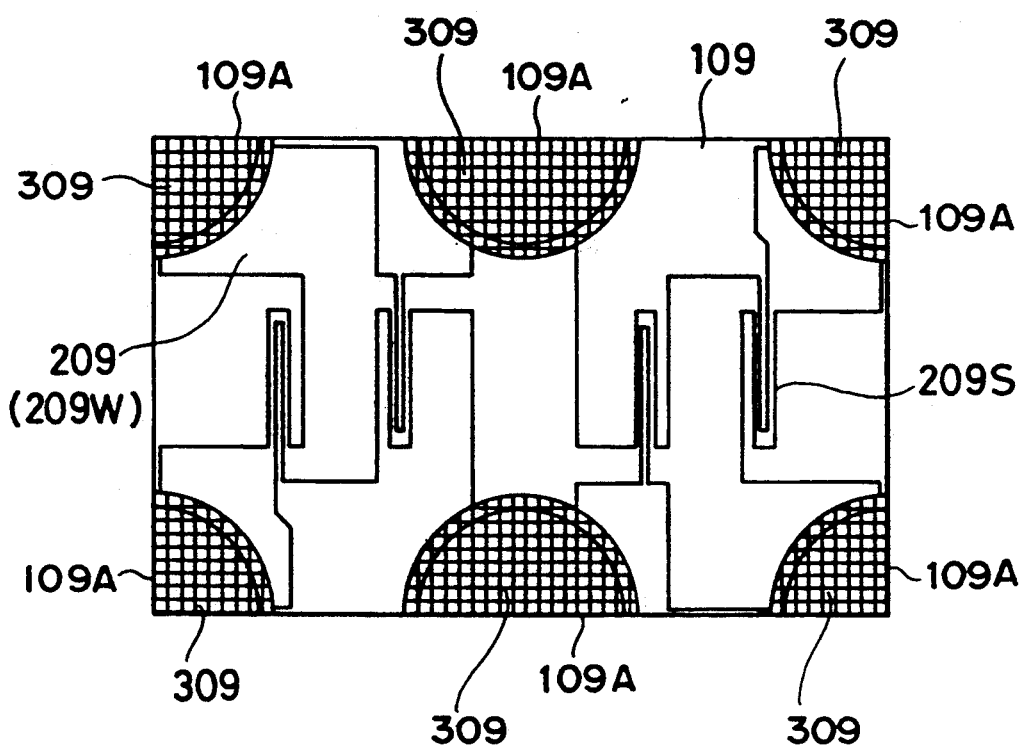
FIGS. 22 and 23 are plan views showing tenth and eleventh embodiments of the magnetoresistive sensor according to the present invention, respectively.

FIG. 22 is a plan view of a tenth embodiment of the magnetoresistive sensor pellet according to the present invention. This embodiment is a magnetoresistive sensor with six terminals in which two semicircular recesses 109A are formed on two peripheral portions of a substrate in addition to four recesses formed at the four corners of the substrate. In this figure, reference numeral 109 represents a ceramic substrate, 209 a ferromagnetic thin film, 209S a magnetic field detecting portion, 209W wiring portions and 309 terminal electrode portions, respectively.

As in Embodiment 10, elements provided with more than 4 terminals can be obtained by forming recesses on peripheral portions on the substrate in addition to the four corners thereof.

EMBODIMENT 11

Figure 23:
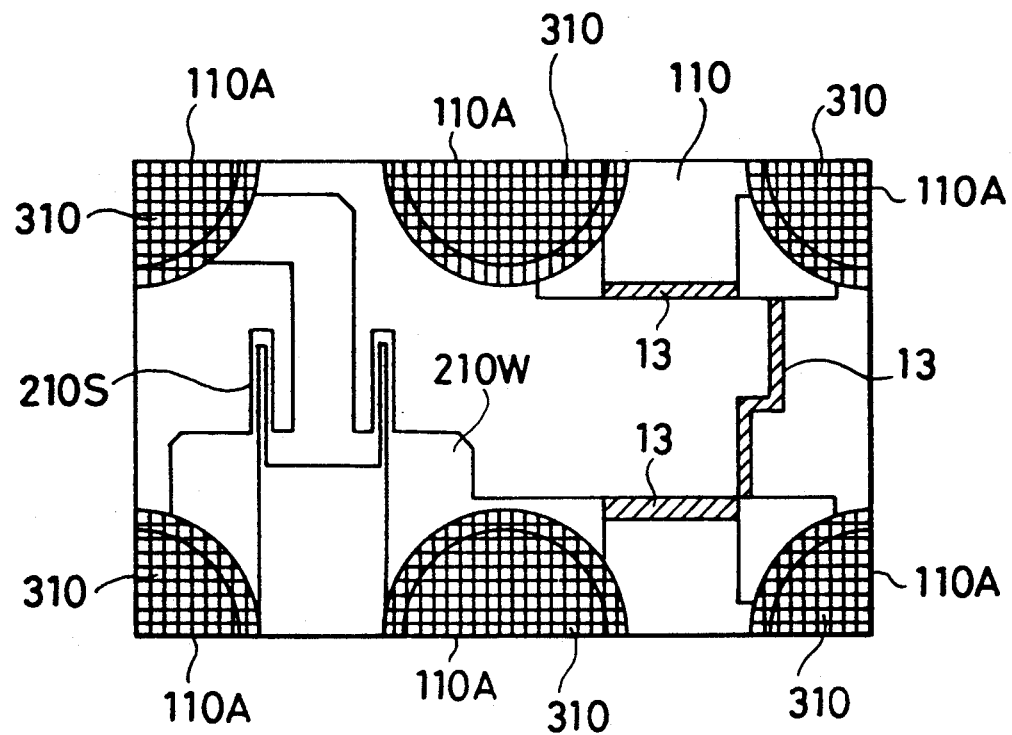

FIG. 23 is a plan view of an eleventh embodiment of the magnetoresistive sensor pellet according to the present invention. This embodiment relates to a sensor in which a pattern for magnetoresistive sensor is formed on the same substrate used in Embodiment 10 and further, a pattern for resistive element comprising, for instance, an NiCr alloy is also formed on the surface of the same substrate.

In FIG. 23, reference numeral 110 represents a ceramic substrate, 110A recessed portions, 210S a magnetic field detecting portion of the magnetoresistive sensor composed of a ferromagnetic thin film, and 210W wiring portions.

Reference numeral 13 represents a resistance portion which is formed by, for instance, depositing an NiCr thin film on the surface of the substrate and then forming the film into a desired pattern. Reference numeral 310 stands for terminal electrode portions.

As has been explained above, if a pattern for magnetoresistive sensor and a pattern for resistance element are formed on the same surface of a substrate, a proper electrical voltage can be applied to the magnetoresistive sensor through the resistance element when a high electrical voltage must be inputted to the magnetoresistive sensor.

Likewise, other functional elements other than resistance elements may be formed on the same surface of a substrate.

EMBODIMENT 12

Figures 24A, 24B:
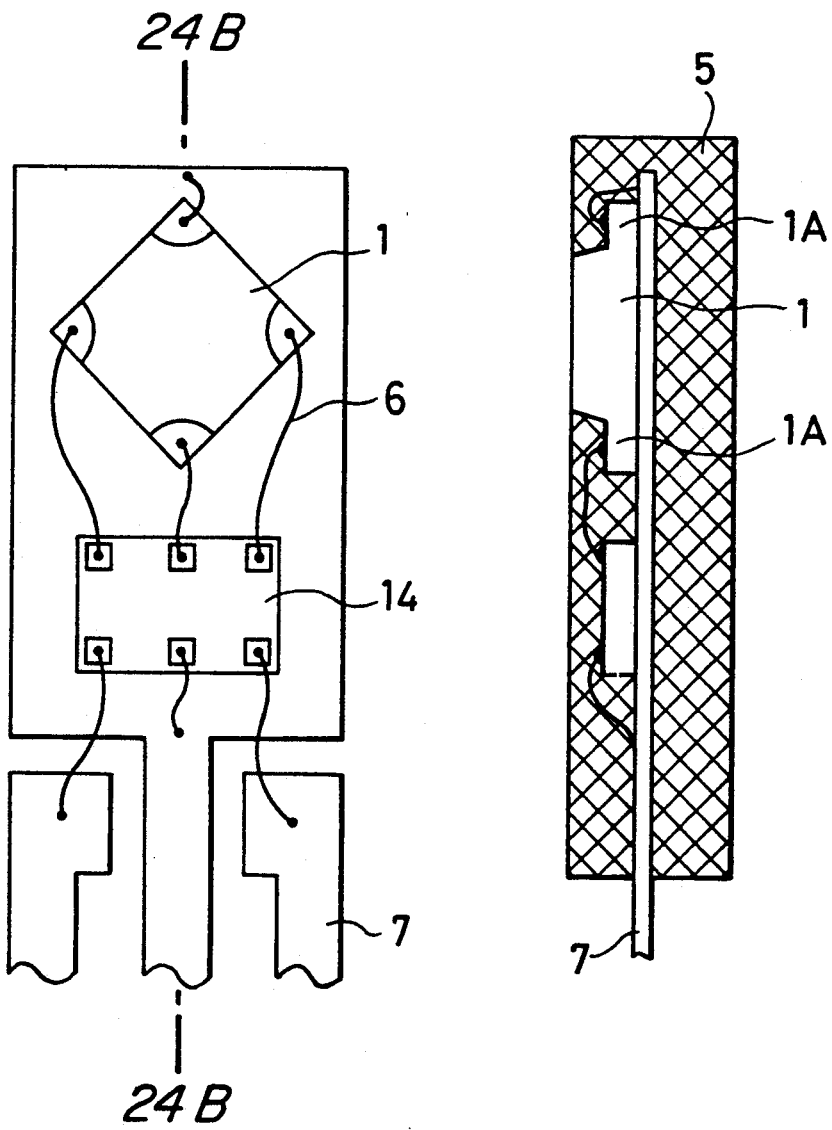
FIGS. 24A and 24B are, respectively, a plan view and a sectional view of a twelfth embodiment of the magnetoresistive sensor according to the present invention.

A twelfth embodiment of the present invention is shown in FIGS. 24A and 24B. This embodiment relates to a magnetoresistive sensor pellet 1 and an integrated circuit element 14 which are electrically connected to one another through wires 6 and which are molded in a package. FIG. 24A is a plan view of these elements prior to the molding and FIG. 24B is a sectional view of these elements after the molding taken along the line A—A in FIG. 24A.

As shown in FIG. 24B, a magnetoresistive sensor can be obtained having a function for processing output signals of sensor pellet in which the level of the mold is not projected over the surface of the sensor if the thickness of the substrate for an integrated circuit element is thinner than that of the magnetoresistive sensor pellet.

INDUSTRIAL APPLICABILITY

As has been described above, in the magnetoresistive sensor pellet of the present invention, a difference in level is established between the surface on which the magnetic field detecting portion is formed and the surface of the terminal electrode portions at the corners or further at the periphery of the substrate. Therefore, when a resin mold is applied to the sensor for the purpose of reinforcing the bonding portions, the mold can be formed such that the surface of the mold is equal to that of the magnetic field detecting portion.

Moreover, the sensor of the present invention can be electrically connected through the wire bonding technique, dence element having high heat resistance can be obtained. In addition, the process for assembling elements can be rationalized and the cost for the assembling can be reduced accordingly.

Furthermore, the production cost can be reduced by miniaturizing the sensor pellet and the thickness of motors can be reduced simultaneously.

We claim:

1. A magnetoresistive sensor comprising:
   a substrate having a surface including corner portions, said substrate having a surface level of at least two corner portions that is lower than that of a remaining substrate surface, said remaining substrate surface being substantially flat;
   at least two terminal electrodes separately disposed at said at least two corner portions having the lower substrate surface, respectively;
   means for detecting a magnetic field including a patterned ferromagnetic thin film disposed on the remaining substrate surface other than said at least two corner portions; and
   a wiring portion disposed on said surface for connecting said magnetic field detecting means to said at least two terminal electrodes.

2. A magnetoresistive sensor as claimed in claim 1, wherein said at least two corner portions on said surface of said substrate have stepped portions for forming the lower surface level.

3. A magnetoresistive sensor as claimed in claim 1, wherein said at least two corner portions on the surface of said substrate are inclined with respect to the remaining substrate surface for forming the lower surface level.

4. A magnetoresistive sensor as claimed in claim 1, wherein the substrate has a regular square shape.

5. A magnetoresistive sensor as claimed in claim 4, wherein said magnetic field detecting means includes a sensor pattern with a longitudinal direction, said longitudinal direction of said sensor pattern being formed parallel to a diagonal line of said square substrate.

6. A magnetoresistive sensor as claimed in claim 1, wherein said terminal electrodes include input and output terminals that are disposed at symmetrical positions with one another with respect to a center of the surface of said substrate.

7. A magnetoresistive sensor as claimed in claim 1, wherein said lower surface level of the corner portions on which said terminal electrode portions are disposed is at least 50 $\mu$m lower than the substrate surface on which said magnetic field detection means is disposed.

8. A magnetoresistive sensor as claimed in claim 1, further comprising an electric resistance element disposed on the surface of said substrate.

9. A magnetoresistive sensor as claimed in claim 1, further comprising functional elements disposed on the surface of said substrate.

10. A magnetoresistive sensor as claimed in claim 1, wherein said wiring portions have a width larger than a width of said patterned ferromagnetic thin film.

11. A magnetoresistive sensor as claimed in claim 1, wherein each one of said terminal electrodes is disposed at a different one of said at least two corner portions.

12. A magnetoresistive sensor comprising:
    a magnetoresistive sensor substrate having a surface including corner portions, said substrate having a surface level of at least two corner portions lower than that of a remaining substrate surface;
    at least two terminal electrodes separately disposed at said at least two corner portions having the lower surface level, respectively;
    means for detecting a magnetic field including a ferromagnetic thin film disposed on the remaining substrate surface other than said at least two corner portions; and
    a magnetic signal processing unit connected to the terminal electrodes and including an integral circuit element disposed on a semiconductor substrate.

13. A magnetoresistive sensor comprising:
    a substrate having a surface including corner portions, said substrate having a surface level of at least two corner portions and a part of peripheral portions that is lower than that of a remaining substrate surface, said remaining substrate surface being substantially flat;
    at least two terminal electrodes separately disposed at said at least two corner portions and said part of peripheral portions having the lower substrate surface, respectively;
    means for detecting a magnetic field including a patterned ferromagnetic thin film disposed on the remaining substrate surface other than said at least two corner portions; and
    a wiring portion disposed on said surface for connecting said magnetic field detecting means to said at least two terminal electrodes, said wiring portion having a width larger than a width of said patterned ferromagnetic thin film.

14. A method for producing a magnetoresistive sensor including a portion for detecting a magnetic field provided on a flat surface of an insulating substrate having a rectangular shape, terminal electrodes provided on at least two corners of said insulating substrate, and a wiring portion for connecting said magnetic field detecting portion to said terminal electrodes, the method comprising the steps of:
    forming a plurality of recesses on a flat surface of an insulating sheet having a rectangular shape, said recesses being aligned in arrays and disposed parallel to both sides of said insulating sheet, said recesses being equidistantly aligned in a direction along one side of said insulating sheet and equidistantly aligned in a direction along another side of said insulating sheet;
    depositing a ferromagnetic thin film on an entire surface of said insulating substrate;
    forming terminal electrodes on said recesses;
    patterning said ferromagnetic thin film to form the magnetic field detecting portion and the wiring portion; and
    cutting said insulating substrate along said arrays to form a plurality of individual magnetoresistive sensor pellets.

15. A method as claimed in claim 14, wherein said insulating sheet is a green insulating sheet, said green insulating sheet being subjected to firing after said plurality of recesses are formed.

16. A method as claimed in claim 15, wherein said recesses forming step comprises the step of pressing said green insulating sheet to form said plurality of recesses.

17. A method as claimed in claim 15, wherein said recesses forming step comprises the steps of:
    preparing a first green insulating sheet having a flat surface and a rectangular shape and a second green insulating sheet having a plurality of holes; and
    laminating said second green insulating sheet on the flat surface of said first insulating green sheet to form a laminated green insulating sheet having a plurality of said recesses on the surface thereof.

18. A method as claimed in claim 14, wherein said plurality of recesses are formed on a surface of an insulating sheet subjected to firing.

* * * * *